(12) United States Patent
Dasgupta et al.

(10) Patent No.: US 10,600,787 B2
(45) Date of Patent: Mar. 24, 2020

(54) SILICON PMOS WITH GALLIUM NITRIDE NMOS FOR VOLTAGE REGULATION

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Portland, OR (US); Peter G. Tolchinsky, Beaverton, OR (US); Roza Kotlyar, Portland, OR (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/078,675

(22) PCT Filed: Mar. 28, 2016

(86) PCT No.: PCT/US2016/024420
§ 371 (c)(1),
(2) Date: Aug. 22, 2018

(87) PCT Pub. No.: WO2017/171699
PCT Pub. Date: Oct. 5, 2017

(65) Prior Publication Data
US 2019/0051650 A1   Feb. 14, 2019

(51) Int. Cl.
*H01L 27/092*   (2006.01)
*H01L 29/66*   (2006.01)
(Continued)

(52) U.S. Cl.
CPC ...... *H01L 27/0922* (2013.01); *H01L 21/0243* (2013.01); *H01L 21/0254* (2013.01);
(Continued)

(58) Field of Classification Search
CPC ............ H01L 27/0922; H01L 21/0254; H01L 21/28264; H01L 21/8258; H01L 29/2003
See application file for complete search history.

(56) References Cited

U.S. PATENT DOCUMENTS

2013/0277683 A1   10/2013   Then et al.
2015/0187924 A1   7/2015   Dasgupta et al.
(Continued)

FOREIGN PATENT DOCUMENTS

WO   2015047355 A1   4/2015
WO   2017171699 A1   10/2017

OTHER PUBLICATIONS

International Search Report and Written Opinion issued in PCT Application No. PCT/US2016/024420 dated Dec. 23, 2016; 12 pages.

*Primary Examiner* — Anthony Ho
(74) *Attorney, Agent, or Firm* — Patent Capital Group

(57) ABSTRACT

This disclosure pertains to a gallium nitride transistor that is formed in a trench etched into a silicon substrate. A gallium nitride layer is on the trench of the silicon substrate. A source electrode and a drain electrode reside on the gallium nitride layer. A gate electrode resides on the gallium nitride layer between the source electrode and the drain electrode. A first polarization layer resides on the gallium nitride layer between the source electrode and the gate electrode, and a second polarization layer resides on the gallium nitride layer between the gate electrode and the drain electrode. The silicon substrate can include a silicon 111 substrate.

25 Claims, 12 Drawing Sheets

(51) Int. Cl.

| | | |
|---|---|---|
| *H01L 29/06* | (2006.01) | |
| *H01L 29/20* | (2006.01) | |
| *H01L 29/778* | (2006.01) | |
| *H01L 21/02* | (2006.01) | |
| *H01L 21/28* | (2006.01) | |
| *H01L 21/8258* | (2006.01) | |
| *H01L 23/498* | (2006.01) | |
| *H01L 23/544* | (2006.01) | |
| *H01L 29/16* | (2006.01) | |
| *H01L 29/205* | (2006.01) | |
| *H01L 29/423* | (2006.01) | |
| *H01L 29/04* | (2006.01) | |
| *H01L 29/417* | (2006.01) | |
| *H01L 21/8238* | (2006.01) | |
| *H04B 1/38* | (2015.01) | |

(52) U.S. Cl.
CPC .. *H01L 21/02381* (2013.01); *H01L 21/02488* (2013.01); *H01L 21/02513* (2013.01); *H01L 21/28264* (2013.01); *H01L 21/8258* (2013.01); *H01L 23/49844* (2013.01); *H01L 23/544* (2013.01); *H01L 27/092* (2013.01); *H01L 29/0649* (2013.01); *H01L 29/16* (2013.01); *H01L 29/2003* (2013.01); *H01L 29/205* (2013.01); *H01L 29/66462* (2013.01); *H01L 29/7786* (2013.01); *H01L 29/7787* (2013.01); *H01L 21/823807* (2013.01); *H01L 29/045* (2013.01); *H01L 29/41766* (2013.01); *H01L 29/4236* (2013.01); *H01L 2223/54493* (2013.01); *H04B 1/38* (2013.01)

(56) References Cited

U.S. PATENT DOCUMENTS

2015/0221727 A1    8/2015    Kub et al.
2016/0056145 A1    2/2016    Nagumo et al.

SILICON PMOS WITH GALLIUM NITRIDE NMOS FOR VOLTAGE REGULATION

CROSS-REFERENCE TO RELATED APPLICATION

This application is a national stage application under 35 U.S.C. § 371 of PCT International Application Serial No. PCT/US2016/024420, filed on Mar. 28, 2016 and entitled "SILICON PMOS WITH GALLIUM NITRIDE NMOS FOR VOLTAGE REGULATION," which is hereby incorporated by reference in its entirety.

TECHNICAL FIELD

This disclosure pertains to combination silicon and gallium nitride (GaN) voltage regulators, and more particularly, to co-integrating silicon-based p-type metal oxide semiconductor (PMOS) and GaN-based n-type metal oxide semiconductor (NMOS) for voltage regulators and radio frequency power amplifiers.

BACKGROUND

Voltage regulators can convert high voltage to smaller voltages for use in electronic devices, such as those used in computing systems. Silicon (Si)-based voltage regulators can suffer from increasing inefficiencies at higher voltages.

DETAILED DESCRIPTION

Figure 1:
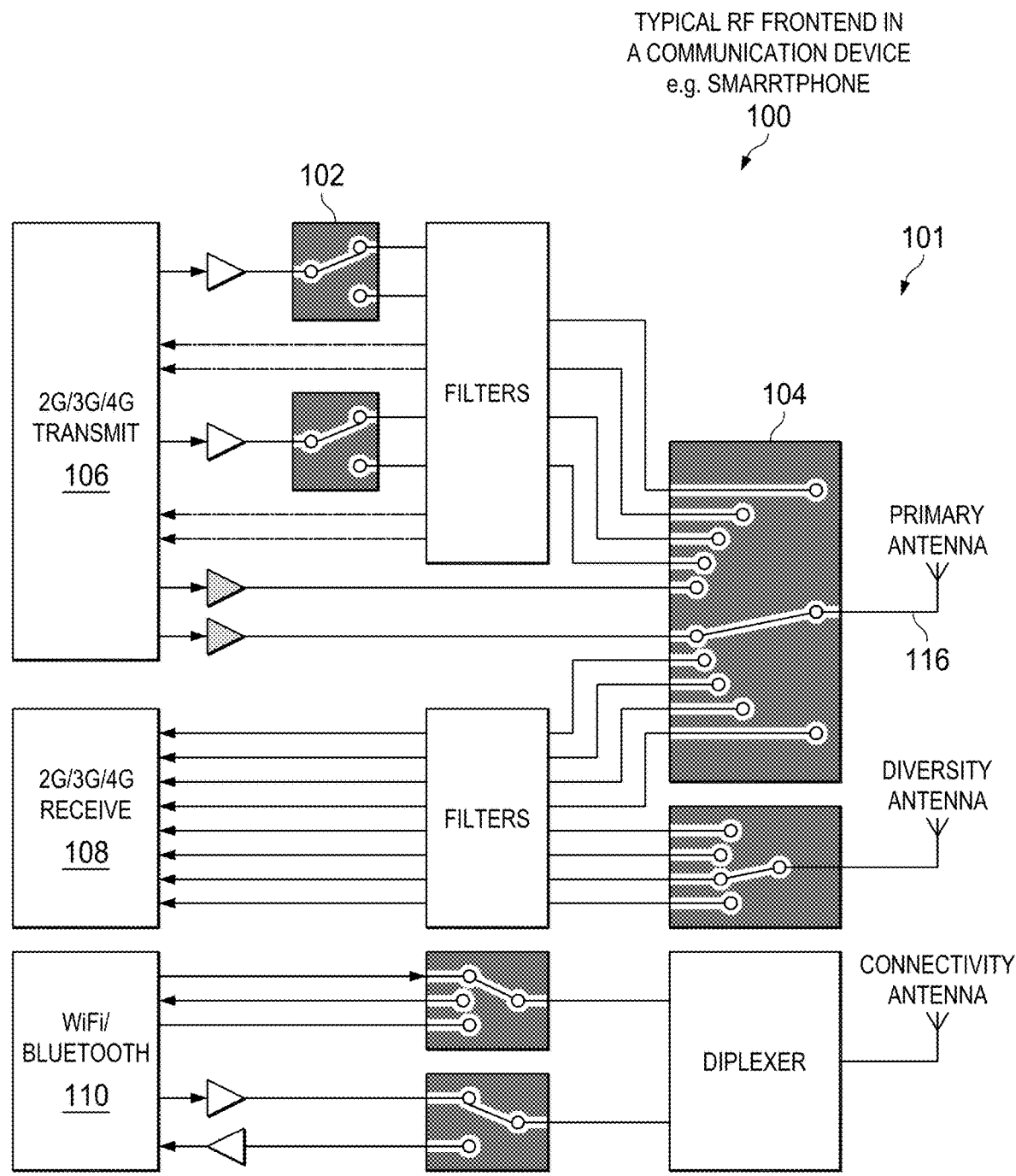
FIG. 1 is a schematic diagram of a communications device that includes a gallium nitride transistor formed on a silicon 111 substrate in accordance with embodiments of the present disclosure.

Described herein is a GaN NMOS transistor (e.g., for a voltage regulator or power amplifier) that can be formed on a silicon (Si) 111 substrate, which can accommodate the formation of a Si PMOS transistor formed on the same substrate, and methods for making the same. The use of Si 110 for a GaN NMOS substrate may pose challenges because of a crystalline symmetry mismatch between the Si and the GaN. Silicon 111 can be used for the GaN NMOS instead of Si 110 because Si 111 and GaN are a hexagonal structures, resulting in a symmetry match between the two crystal structures.

This disclosure describes identifying a Si PMOS trigate orientation to obtain high performance PMOS integration with a high performance GaN NMOS device on 200 or 300 mm Si 111 substrates. For monolithic high voltage devices using GaN transistors controller and driver circuits are used that utilize Si CMOS logic. Si 111 substrate is used for GaN epitaxy as it offers the lowest lattice mismatch to GaN amongst other Si substrates, and also the same crystal lattice symmetry for Wurtzite GaN epitaxy. Identifying Si PMOS orientation for high performance CMOS in a Si 111 substrate and forming a GaN NMOS device is said Si 111 substrate are described in this disclosure.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

The terms "over," "under," "between," "on," or "residing on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Furthermore, the term "residing on" is contemplated to include being formed from, such as through epitaxial growth, chemical vapor deposition, or other semiconductor processing techniques. The term "residing on" can include being electrically, physically, or electrically and physically connected. Additionally, the term "residing on" can include intermediate layers between two materials to the extent that intermediate layers are used to facilitate growth of a layer of material from or on another material. For example, a gallium nitride layer can reside on a silicon 111 substrate. The gallium nitride layer can be epitaxially grown on the Si 111 substrate directly or from a seed layer on the Si 111 substrate.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 is a schematic diagram of a communications device 100 that includes a gallium nitride transistor formed on a silicon 111 substrate in accordance with embodiments of the present disclosure. The communications device 100 can include various computing devices, such as a processor and a memory. As shown in FIG. 1, the communications device 100 includes a radio frequency frontend 101. Radio frequency (RF) frontend can include a radio transmitter 106, a radio receiver 108, and/or a wifi or Bluetooth (or other short range wireless radio) 110. In some embodiments, the RF frontend 101 can include a cellular transceiver configured to transmit and receive radio signals in a wireless format from one or more antennas 116.

The RF frontend 101 can also include a switch, such as switch 102 or switch 104. The switch 102 or 104 can include one or more GaN NMOS transistors as well as other types of transistors. GaN NMOS transistors can accommodate higher voltages than Si-based NMOS transistors.

Figure 2:
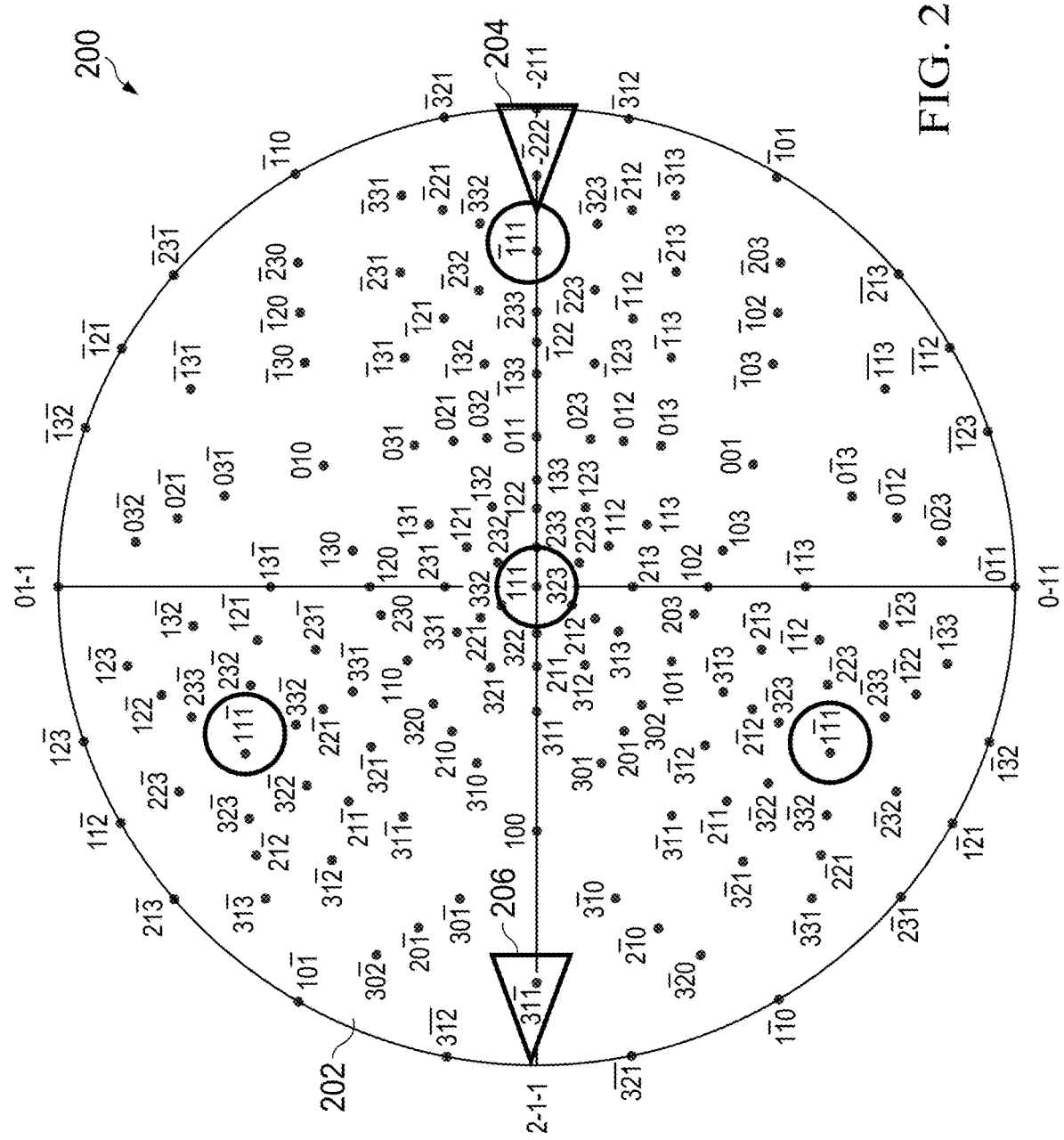
FIG. 2 is a schematic illustration of a stereographic representation of a silicon 111 wafer and notch locations in accordance with embodiments of the present disclosure.

FIG. 2 is a schematic illustration of a stereographic representation of a silicon 111 wafer 202 and notch locations 204 and 206 in accordance with embodiments of the present disclosure. The silicon 111 wafer 202 can be a 300 mm wafer. The stereographic projection shows relativistic positions of silicon atoms for different crystal orientations projected onto a two-dimensional surface. The stereographic projection can be used to show locations on a wafer where the wafer should be notched for identification of the crystallographic planes of the wafer for semiconductor processing. The projection shows the 111 projection at the center (circled) and the equivalent orientation atoms projected and circled.

In FIG. 2, a first notch is made at a first notch location 204 at a point where a −211 atomic projection is located. The −211 atomic projection is 90 degrees from the 01−1 and 0−11 atomic projection points on the circumference of the silicon 111 wafer 202. In some embodiments, a notch can be made at notch location 206, which coincides with the 2−1−1 atomic projection. The 2−1−1 atomic projection is also 90 degrees from the 01−1 and 0−11 atomic projection points on the circumference of the silicon 111 wafer 202.

Figure 3:
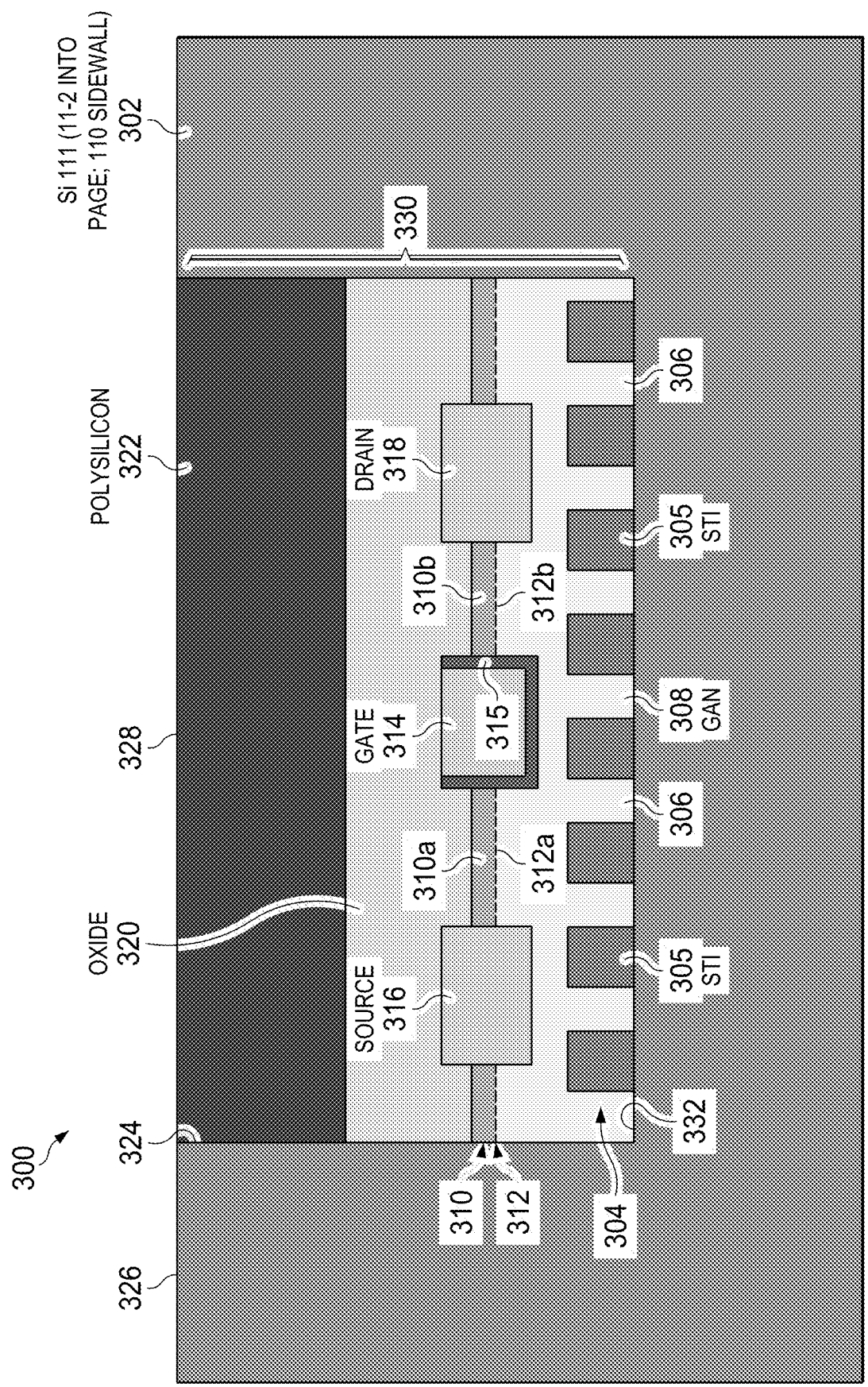
FIG. 3 is a schematic illustration of a gallium nitride transistor formed on a silicon 111 substrate in accordance with embodiments of the present disclosure.

FIG. 3 is a schematic illustration of a gallium nitride transistor 300 formed on a silicon 111 substrate 302 in accordance with embodiments of the present disclosure. The silicon (Si) 111 substrate 302 includes a trench 330 etched into the substrate 302 (shown in more detail in FIG. 5A. The trench 330 can include a trench surface 332 and sidewall 324. The trench 330 has a sidewall 324 that has a 110 crystalline orientation. FIG. 3 shows the 11−2 crystalline orientation "into the page." The silicon 111 substrate 302 can include a top side 326 that can be considered the top of the substrate. The substrate crystalline orientation as shown in FIG. 3—and the orientation of the GaN transistor features relative to the substrate's crystalline orientation—facilitate the formation of silicon PMOS devices on the top side 326 and on the polysilicon 322. The silicon PMOS devices and the GaN NMOS can together form a hybrid CMOS device for RF and PA applications.

The GaN transistor 300 includes a GaN layer 308 grown from the trench surface 332. Some embodiments include a shallow trench isolation (STI) layer 304. The STI layer 304 includes a plurality of oxide islands 305. Each of the oxide islands 305 are separated by a trench 306. The GaN layer 308 is formed epitaxially in the trenches 306 (in some embodiments, from a seed layer to facilitate epitaxial growth).

A polarization layer 310 can be foil led on the GaN layer 308. The polarization layer 310 can include aluminum+ nitride alloy, such as aluminum indium nitride ($Al_xIn_{1-x}N$) or aluminum gallium nitride ($Al_xGa_{1-x}N$). Part of the polarization layer 310 can include an intermediate layer of aluminum nitride (AlN) that can be deposited on the GaN layer to help facilitate the formation of the remainder of the polarization layer and to further support mobility in the resulting channel. A conductive channel 312 is formed at the interface of the polarization layer 310 and the GaN layer 308.

A gate electrode 314 can be formed from etching through the polarization layer to expose the GaN layer 308 (or the intermediate AlN layer). A metal electrode can be deposited on the exposed GaN layer 308. Similarly, a metal source electrode 316 and a metal drain electrode 318 can be formed by etching through the polarization layer to expose the GaN layer 308 and depositing a conductive material in the exposed GaN layer region. A polarization layer portion 310a between the source 316 and the gate 314 is isolated because of the etching of the polarization material to expose the underlying GaN layer 308. This results in a conductive channel 312a forming along the interface between the GaN layer 308 and the polarization layer 310a between the source 316 and the gate 314. Similarly, a polarization layer portion 310b between the drain 318 and the gate 314 is isolated because of the etching of the polarization material to expose the underlying GaN layer 308. This results in a conductive channel 312b forming along the interface between the GaN layer 308 and the polarization layer 310b between the drain 318 and the gate 314. To the extent that the polarization layer 310 is segmented by the etching process (to forth the gate, source, and drain), the disclosure refers to each segment as a polarization layer.

An oxide layer 320 is formed on the polarization layer 310 and the source 316, gate 314, and drain 318. A polysilicon layer 322 is formed on the oxide 320. A top portion 328 of the polysilicon 322 is coplanar with a top portion 326 of the silicon 111 substrate 302.

Figure 4:
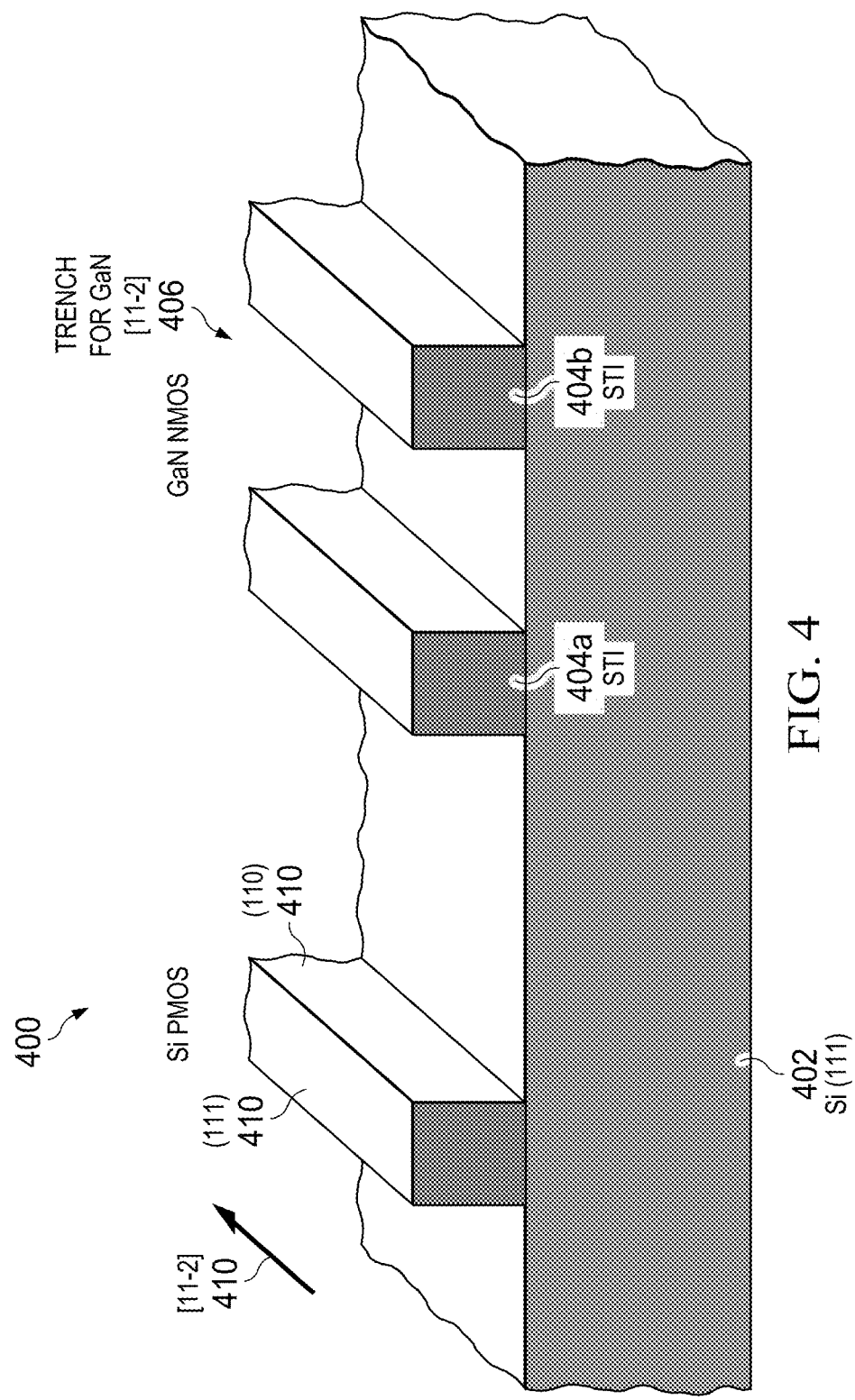
FIG. 4 is a schematic diagram of a perspective view of a silicon 111 substrate showing crystal structure directions in accordance with embodiments of the present disclosure.

FIG. 4 is a schematic diagram of a perspective view 400 of a silicon 111 substrate 402 showing crystalline orientation directions in accordance with embodiments of the present disclosure. The perspective view 400 shows the crystalline orientations for the silicon 111 substrate and the relative orientations of the STI oxide islands 404a and 404b. The STI oxide islands 404a are formed from the silicon 111 substrate with a long axis in the [11−2] direction. The STI trench 406 separates each STI oxide island. The GaN NMOS transistor can be grown in the STI trench 406 as described in FIG. 3 and FIGS. 5A-5C.

A silicon 111 island would have a (110) sidewall 414 and can be formed in the [11−2] direction 412. The silicon topside 410 would reflect the 111 substrate orientation.

Figure 5A:
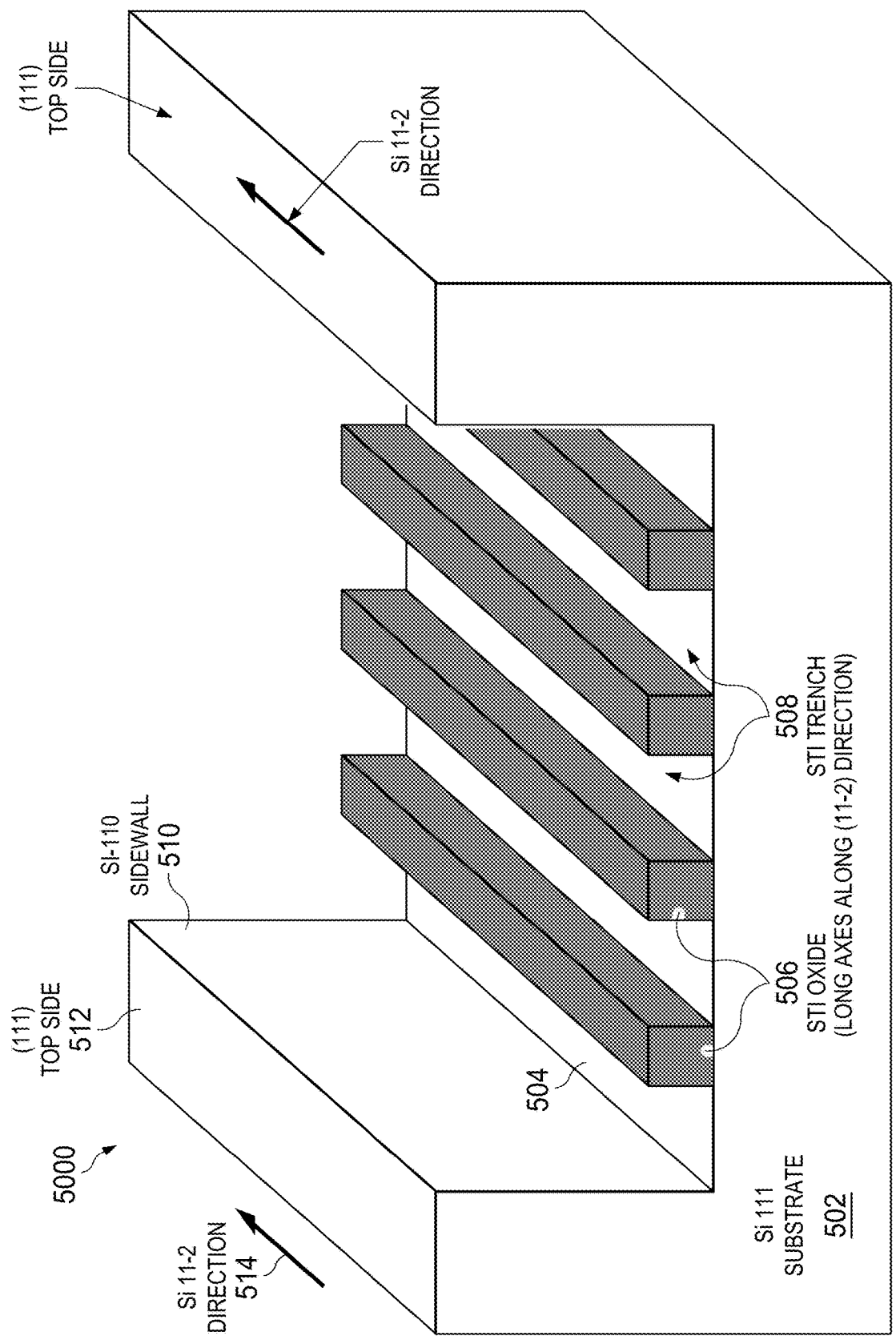
FIG. 5A-5F are schematic diagrams for forming a gallium nitride transistor on a silicon 111 substrate in accordance with embodiments of the present disclosure.

FIG. 5A-5F are schematic diagrams for forming a gallium nitride transistor on a silicon 111 substrate 502 in accordance with embodiments of the present disclosure. FIG. 5A shows the formation 5000 of shallow trench isolation (STI) oxide islands 506. The silicon 111 substrate 502 can be etched to form a substrate trench 504. The STI oxide islands can be patterned and deposited to form islands having a long axis in the (11−2) crystalline direction. Each oxide island 506 is separated from its nearest neighbor by a STI trench 508. The oxide islands 506 and STI trenches 508 can be referred to as an STI layer.

The sidewall of the trench 504 is a silicon 110 sidewall. The topside 512 is the (111) direction.

Figure 5B:
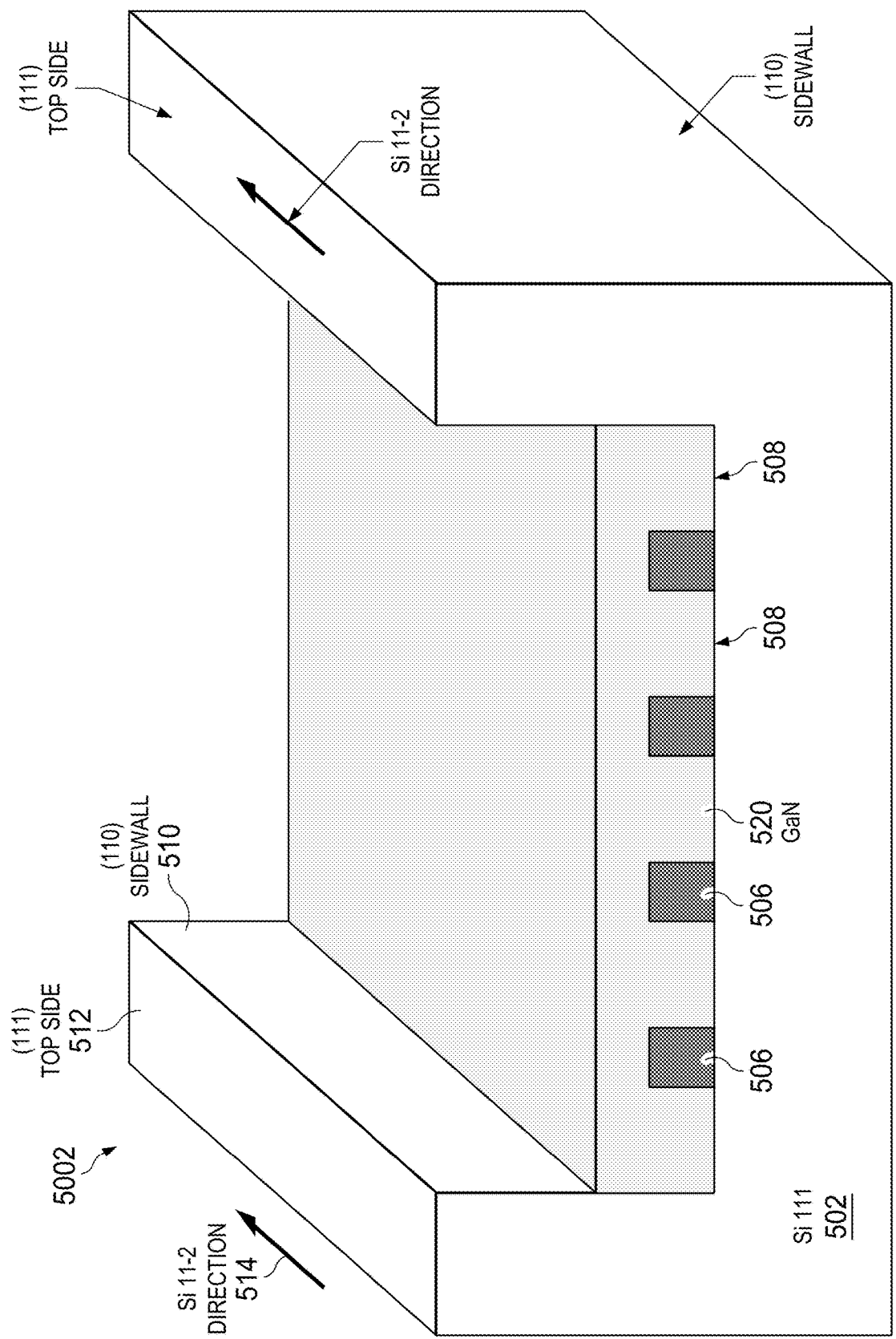

FIG. 5B shows the formation 5002 of the gallium nitride layer 520. The GaN layer 520 can be formed in the substrate trench—and more specifically, from the STI trenches between the STI oxide islands.

Figure 5C:
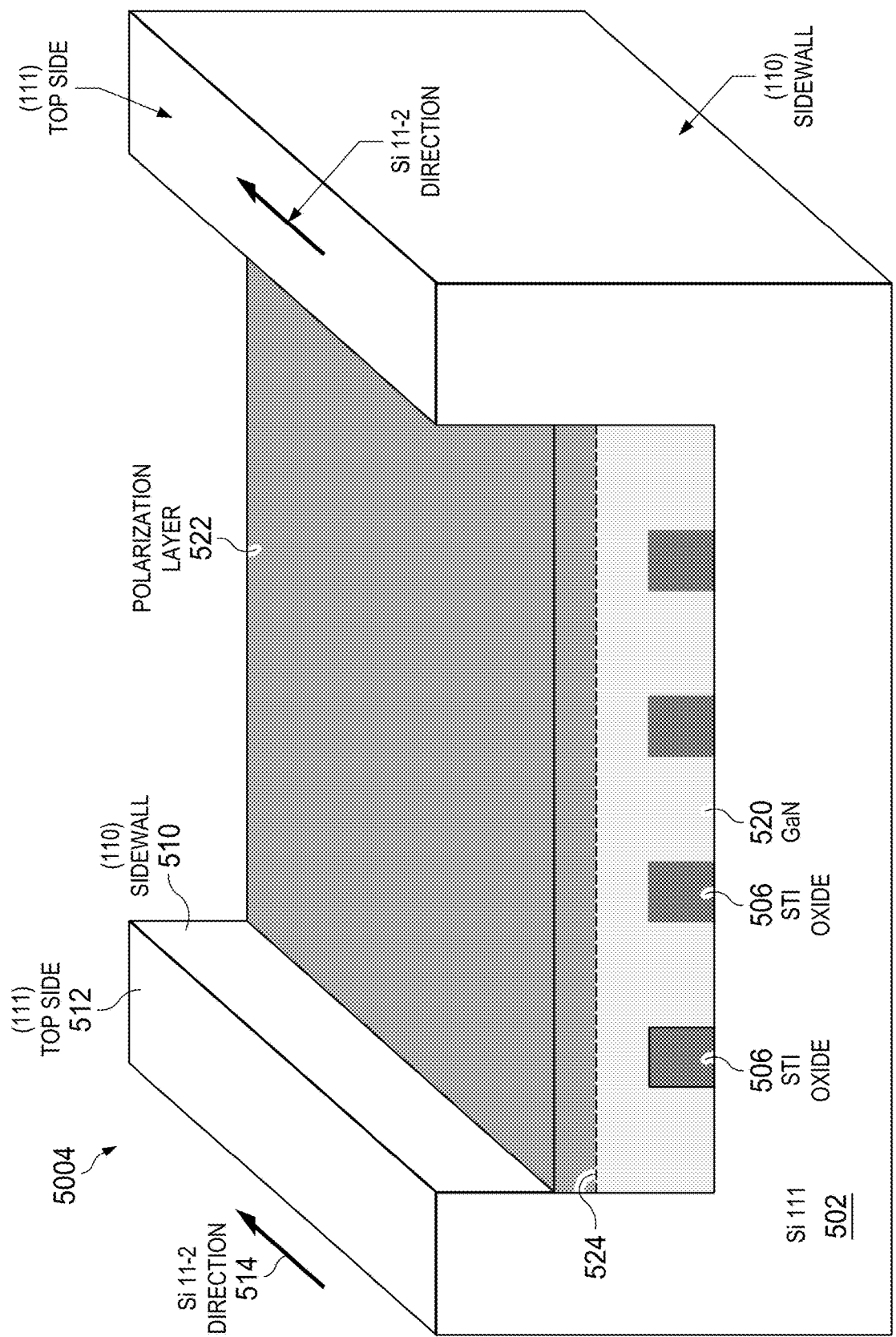

FIG. 5C shows the formation 5004 of the polarization layer 522. The formation of the polarization layer 522 can include an initial deposition of aluminum nitride as a seed layer. A layer of aluminum indium nitride ($Al_xIn_{1-x}N$) or aluminum gallium nitride ($Al_xGa_{1-x}N$) can be deposited onto the seed layer to form the remainder of the polarization layer 522. The seed layer of AlN, if used, can also promote mobility of conductive elements in the conductive channel 524 formed at the interface between the polarization layer 522 and the GaN layer 520.

Figure 5D:
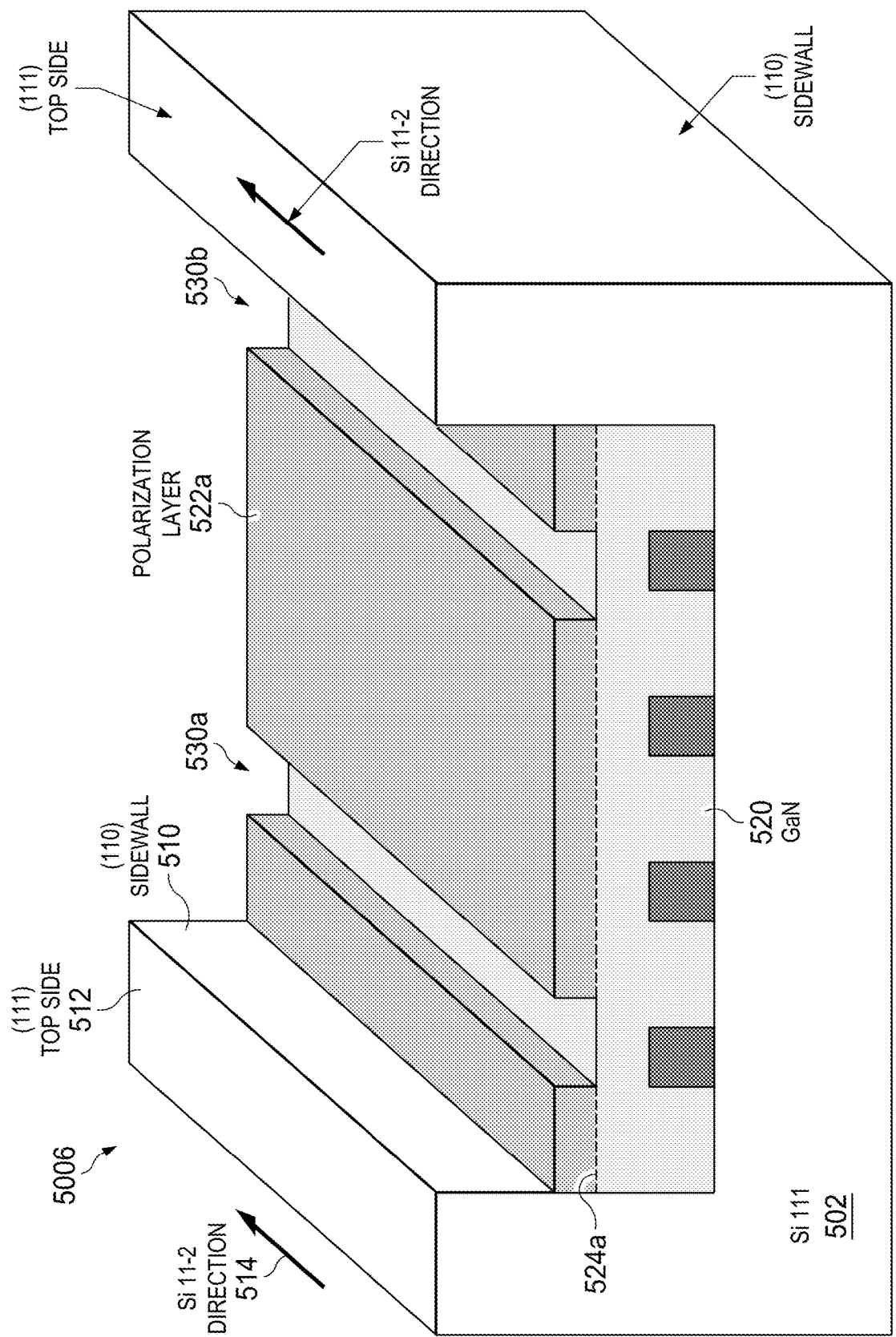
Figure 5E:
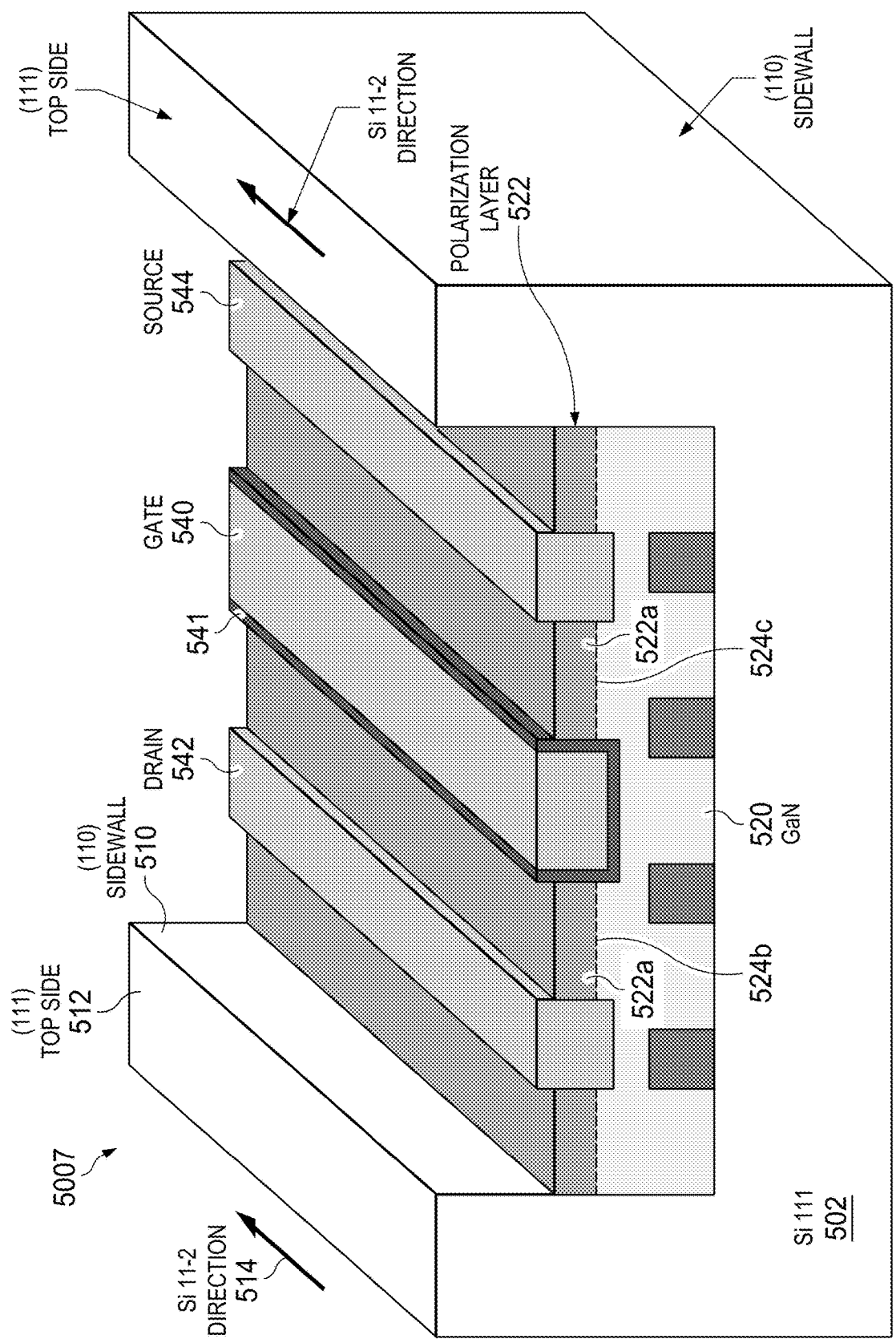

FIG. 5D-5E shows the formation 5006 of the gate, source, and drain. In FIG. 5D, the polarization layer is etched to reveal the GaN layer 520. For example, the GaN layer can be exposed as trenches 530a and 530b. The trenches 530a-b isolate the polarization portion 522a from other portions of the polarization layer. As described below, the source/drain can be formed in the trench 530a/530b, respectively. The removal of portions of the polarization layer 524 results in isolated conductive channel 524a.

FIG. 5E shows the formation 5007 the gate, source, and drain electrodes. The gate electrode 540 can be deposited using patterned deposition. Similarly, the drain electrode 542 and the source electrode 544 can be deposited using patterned deposition. The electrode metals can include titanium, tungsten, or other metal. The long axis of the electrodes is in a direction parallel to the Si 11–2 direction 514.

Figure 5F:
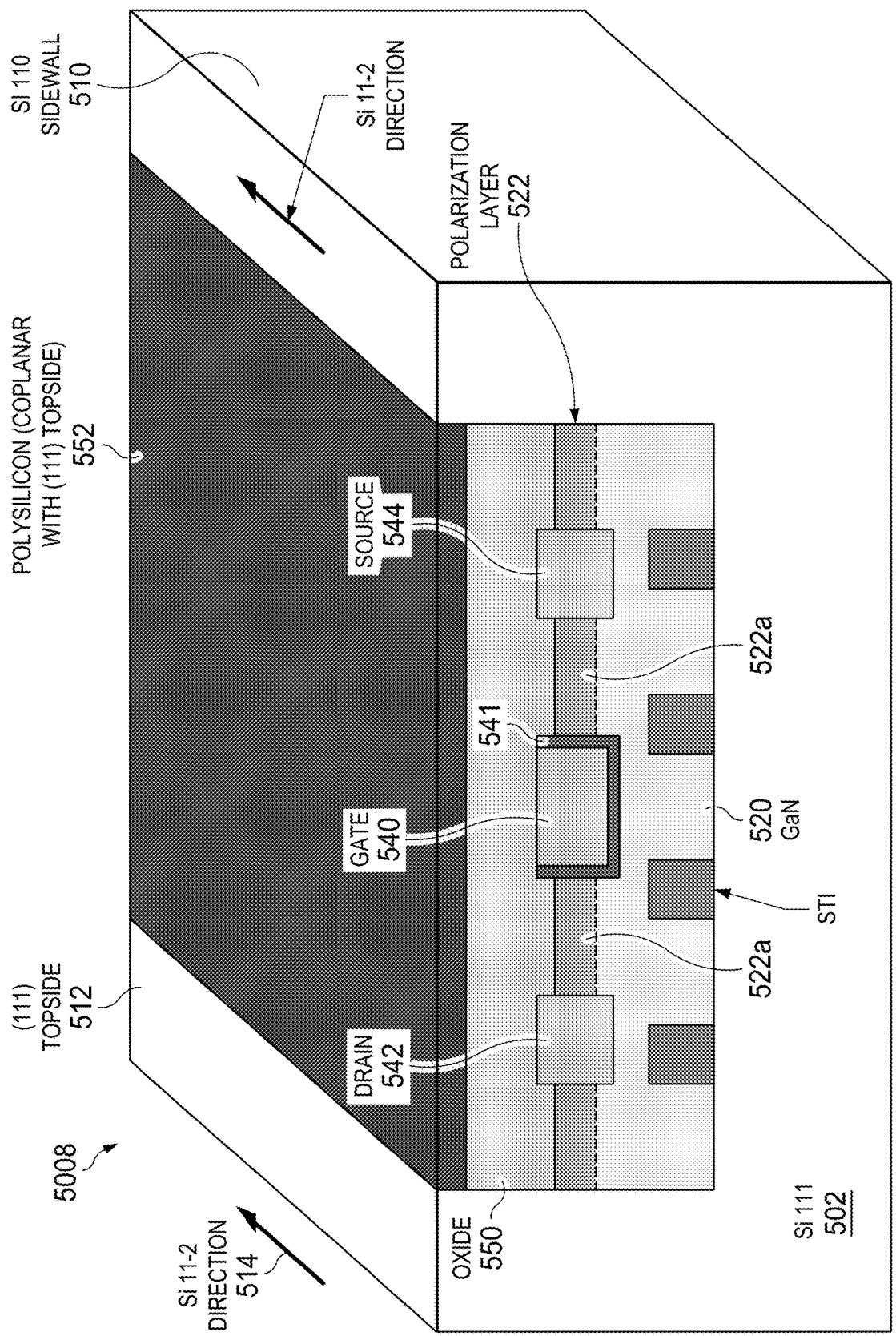

FIG. 5F shows the formation 5008 of the oxide layer 550 on the electrodes 540, 542, and 544, and on the polarization layer. The oxide can be deposited using known techniques for forming an oxide layer. A polysilicon layer 552 can be formed on the oxide 550. The polysilicon can be formed using known techniques. The polysilicon 552 can undergo a planarization process to planarize the polysilicon to be coplanar with the topside 512 of the silicon 111 substrate 502.

Figure 6:
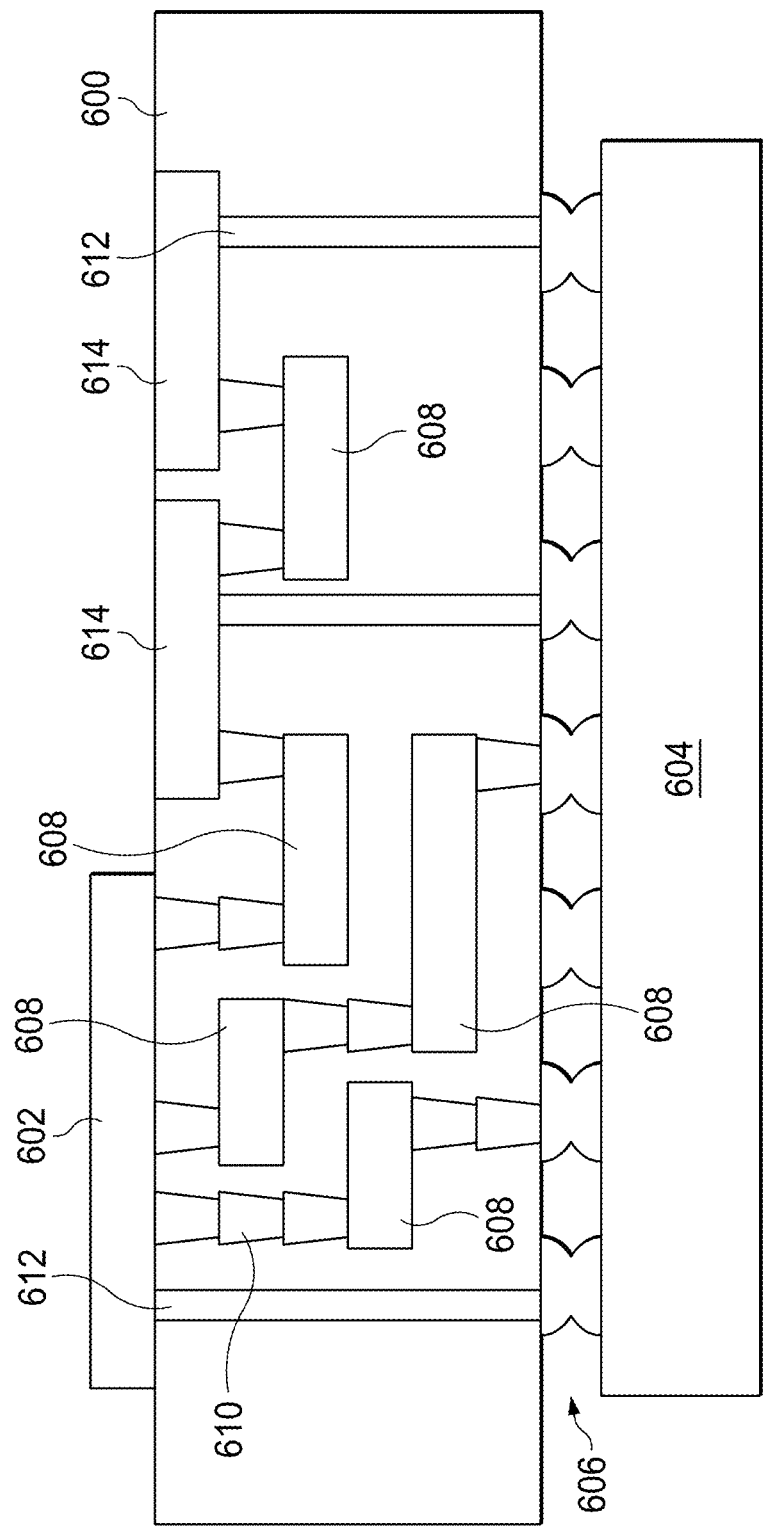
FIG. 6 is an interposer implementing one or more embodiments of the invention in accordance with embodiments of the present disclosure.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the invention, apparatuses or processes disclosed herein may be used in the fabrication of interposer 600.

Figure 7:
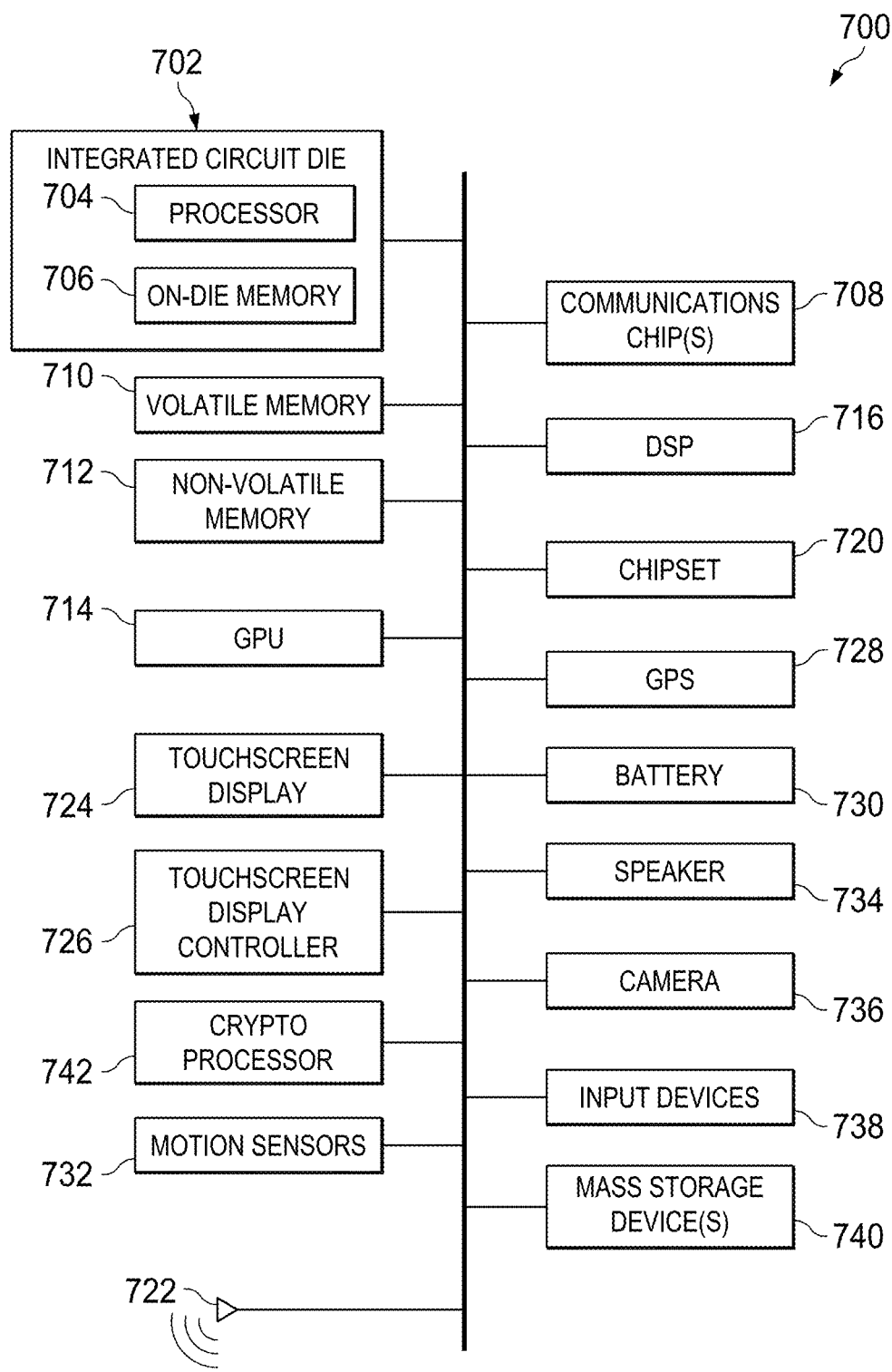
FIG. 7 is a computing device built in accordance with an embodiment of the invention in accordance with embodiments of the present disclosure.

FIG. 7 illustrates a computing device 700 in accordance with one embodiment of the invention. The computing device 700 may include a number of components. In one embodiment, these components are attached to one or more motherboards. In an alternate embodiment, some or all of these components are fabricated onto a single system-on-a-chip (SoC) die. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a CPU 704 as well as on-die memory 706, often used as cache memory, that can be provided by technologies such as embedded DRAM (eDRAM) or spin-transfer torque memory (STTM or STT-MRAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 728 or other power source, a power amplifier (not shown), a voltage regulator (not shown), a global positioning system (GPS) device 728, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors or metal interconnects, that are formed in accordance with embodiments of the disclosure. The term "processor" may refer to any device or portion of a device that processes electronic data from registers and/or memory to transform that electronic data into other electronic data that may be stored in registers and/or memory.

The communications logic unit 708 may also include one or more devices, such as transistors or metal interconnects, that are formed in accordance with embodiments of the disclosure. The communications logic unit 708 can include a communications front end.

In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Example 1 is an apparatus that includes a silicon substrate including a trench; a gallium nitride layer on the trench of the silicon substrate; a source electrode on the gallium nitride layer; a drain electrode on the gallium nitride layer; a gate electrode on the gallium nitride layer between the source electrode and the drain electrode; and a first polarization layer on the gallium nitride layer between the source electrode and the gate electrode, and a second polarization layer on the gallium nitride layer between the gate electrode and the drain electrode.

Example 2 may include the subject matter of example 1, and may also include an oxide layer on the source electrode, the drain electrode, the gate electrode, and on the polarization layer between the source electrode, the drain electrode, and the gate electrode.

Example 3 may include the subject matter of example 2, and also including a polysilicon layer on the oxide layer.

Example 4 may include the subject matter of example 3, wherein a top side of the polysilicon layer is substantially coplanar with a top side of the silicon substrate.

Example 5 may include the subject matter of example 1, and may also include an oxide layer in the trench, the oxide comprising an island of oxide having a long axis in a direction substantially parallel to the [11-2] direction, the island of oxide adjacent to an isolation trench exposing one or both of the silicon substrate or a gallium nitride seed layer on the silicon substrate.

Example 6 may include the subject matter of example 5, wherein a gallium nitride seed layer is disposed on the silicon substrate in the isolation trench adjacent to the island of oxide, the gallium nitride formed on the seed layer.

Example 7 may include the subject matter of example 1, and may also include a two dimensional electron gas (2 DEG) at an interface between the gallium nitride layer and the first polarization layer; and a 2 DEG at an interface between the gallium nitride layer and the second polarization layer.

Example 8 is a method for forming a gallium nitride transistor on a silicon substrate, the method including providing a silicon substrate; forming a substrate trench in the silicon substrate; forming an oxide in the substrate trench, the oxide layer in the substrate trench comprising a plurality of oxide islands each separated by an isolation trench, each oxide island comprising a long axis on a direction parallel to the [11-2] direction; forming a gallium nitride layer in the isolation trenches and on the oxide islands; forming a polarization layer on the gallium nitride layer; etching the polarization layer in a first location to expose a first portion of the gallium nitride; forming a source electrode in the first portion of the gallium nitride; etching the polarization layer in a second location to expose a first portion of the gallium nitride; forming a drain electrode in the second portion of the gallium nitride; etching the polarization layer in a third location to expose a first portion of the gallium nitride; forming a gate electrode in the third portion of the gallium nitride, the gate electrode between the source electrode and the drain electrode; forming an oxide layer on the source electrode, the gate electrode, and the drain electrode, and on the polarization layer; forming a polysilicon layer on the oxide layer; and planarizing the polysilicon layer to be coplanar with the silicon substrate.

Example 9 may include the subject matter of example 8, and may also include identifying a −211 stereographic location on an edge of the silicon wafer; and notching the silicon wafer at the −211 stereographic location.

Example 10 may include the subject matter of example 8, wherein forming a gate electrode further comprises forming a gate dielectric and forming a gate metal on the gate dielectric.

Example 11 may include the subject matter of example 9, wherein the −211 stereographic location is located at the edge of the silicon substrate 90 degrees from a 01-1 stereographic location on the edge of the silicon substrate.

Example 12 may include the subject matter of any of examples 8 or 9, and may also include identifying a 2-1-1 stereographic location on an edge of the silicon wafer; and notching the silicon wafer at the 2-1-1 stereographic location.

Example 13 is a computing device that includes a processor mounted on a substrate; a communications logic unit within the processor; a memory within the processor; a graphics processing unit within the computing device; an antenna within the computing device; a display on the computing device; a battery within the computing device; a power amplifier within the processor; and a voltage regulator within the processor. The computing device includes a transistor that includes a silicon substrate comprising a trench; a gallium nitride layer on the trench of the silicon substrate; a source electrode on the gallium nitride layer; a drain electrode on the gallium nitride layer; a gate electrode on the gallium nitride layer between the source electrode and the drain electrode; and a first polarization layer on the gallium nitride layer between the source electrode and the gate electrode, and a second polarization layer on the gallium nitride layer between the gate electrode and the drain electrode.

Example 14 may include the subject matter of example 13, and may also include an oxide layer on the source electrode, the drain electrode, the gate electrode, and on the polarization layer between the source electrode, the drain electrode, and the gate electrode.

Example 15 may include the subject matter of example 14, further comprising a polysilicon layer on the oxide layer.

Example 16 may include the subject matter of example 15, wherein a top side of the polysilicon layer is substantially coplanar with a top side of the silicon substrate.

Example 17 may include the subject matter of example 13, and may also include an oxide layer in the trench, the oxide layer in the trench comprising an island of oxide having a long axis in a direction substantially parallel to the [11-2] direction, the island of oxide adjacent to an isolation trench exposing one or both of the silicon 111 substrate or a gallium nitride seed layer on the silicon substrate.

Example 18 may include the subject matter of example 17, wherein a gallium nitride seed layer is disposed on the silicon substrate in the isolation trench adjacent to the island of oxide, the gallium nitride formed on the seed layer.

Example 19 may include the subject matter of example 13, and may also include a two dimensional electron gas (2 DEG) at an interface between the gallium nitride layer and the first polarization layer; and a 2 DEG at an interface between the gallium nitride layer and the second polarization layer.

Example 20 may include the subject matter of example 13, wherein the computing device comprises one or both of a radio frequency transceiver to transmit and receive wireless radio frequency signals.

Example 21 may include the subject matter of example 13, wherein the silicon substrate is a p-type silicon substrate.

Example 22 may include the subject matter of example 5, wherein the oxide layer comprises a shallow trench isolation oxide.

Example 23 may include the subject matter of example 10, wherein the oxide layer on the substrate trench comprises a shallow trench isolation oxide.

Example 24 may include the subject matter of example 20, wherein the oxide in the trench is a shallow trench isolation oxide.

Example 25 may include the subject matter of any of examples 1-24, wherein the silicon substrate includes a silicon 111 substrate.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a silicon substrate comprising a trench;
a gallium nitride material in the trench of the silicon substrate;
a source electrode on the gallium nitride material;
a drain electrode on the gallium nitride material;
a gate electrode on the gallium nitride material between the source electrode and the drain electrode; and
an island of oxide in the trench, the island of oxide having a long axis in a direction substantially parallel to a [11–2] direction of the silicon substrate and being adjacent to a further trench,
wherein the further trench exposes one or both of the silicon substrate and a gallium nitride seed layer on the silicon substrate, and
wherein the further trench is filled with the gallium nitride material.

2. The apparatus of claim 1, further comprising a first polarization layer over a portion of the gallium nitride material between the source electrode and the gate electrode, and a second polarization layer over a portion of the gallium nitride material between the gate electrode and the drain electrode.

3. The apparatus of claim 2, further comprising an oxide layer over each of the source electrode, the drain electrode, the first polarization layer, and the second polarization layer.

4. The apparatus of claim 3, further comprising a polysilicon layer over the oxide layer.

5. The apparatus of claim 4, wherein a top side of the polysilicon layer is substantially coplanar with a top side of the silicon substrate.

6. The apparatus of claim 4, further comprising a silicon P-type metal-oxide-semiconductor (PMOS) device on the polysilicon layer.

7. The apparatus of claim 2, further comprising a two dimensional electron gas (2DEG) at an interface between the gallium nitride material and the first polarization layer; and
a 2DEG at an interface between the gallium nitride material and the second polarization layer.

8. The apparatus of claim 1, wherein the gallium nitride seed layer is on the silicon substrate in the further trench adjacent to the island of oxide, the gallium nitride material being on the seed layer.

9. The apparatus of claim 1, wherein the island of oxide comprises a shallow trench isolation oxide.

10. The apparatus of claim 1, wherein the silicon substrate is a silicon 111 substrate.

11. The apparatus of claim 1, wherein the gate electrode has a long axis in the direction substantially parallel to the [11–2] direction of the silicon substrate.

12. The apparatus of claim 1, wherein the source electrode has a long axis in the direction substantially parallel to a [11–2] direction of the silicon substrate.

13. The apparatus of claim 1, wherein the drain electrode has a long axis in the direction substantially parallel to a [11–2] direction of the silicon substrate.

14. The apparatus of claim 1, wherein a sidewall of the trench is a silicon (110) sidewall.

15. The apparatus of claim 1, wherein the island of oxide is one of a plurality of islands of oxide in the trench, each island of oxide having a long axis in the direction substantially parallel to the [11–2] direction of the silicon substrate.

16. The apparatus of claim 1, wherein the apparatus is one of a voltage regulator, a power amplifier, a computing device, and a processor.

17. An apparatus comprising:
a silicon substrate comprising a trench;
a gallium nitride material in the trench of the silicon substrate;
a source electrode on the gallium nitride material;
a drain electrode on the gallium nitride material;
a gate electrode on the gallium nitride material between the source electrode and the drain electrode;
a first polarization layer over a portion of the gallium nitride material between the source electrode and the gate electrode, and a second polarization layer over a portion of the gallium nitride material between the gate electrode and the drain electrode; and
an oxide layer over each of the source electrode, the drain electrode, the first polarization layer, and the second polarization layer.

18. The apparatus of claim 17, further comprising a polysilicon layer over the oxide layer.

19. The apparatus of claim 18, wherein a top side of the polysilicon layer is substantially coplanar with a top side of the silicon substrate.

20. The apparatus of claim 17, wherein at least one of the gate electrode, the source electrode, and the drain electrode has a long axis in a direction substantially parallel to a [11–2] direction of the silicon substrate.

21. The apparatus of claim 17, wherein a sidewall of the trench is a silicon (110) sidewall.

22. The apparatus of claim 17, wherein the apparatus is one of a voltage regulator, a power amplifier, a computing device, and a processor.

23. An apparatus comprising:
   a silicon substrate comprising a trench;
   a gallium nitride material in the trench of the silicon substrate;
   a source electrode on the gallium nitride material;
   a drain electrode on the gallium nitride material; and
   a gate electrode on the gallium nitride material between the source electrode and the drain electrode,
   wherein at least one of the gate electrode, the source electrode, and the drain electrode has a long axis in a direction substantially parallel to a [11–2] direction of the silicon substrate.

24. The apparatus of claim 23, wherein the silicon substrate is a silicon 111 substrate.

25. The apparatus of claim 23, wherein the apparatus is one of a voltage regulator, a power amplifier, a computing device, and a processor.

\* \* \* \* \*

UNITED STATES PATENT AND TRADEMARK OFFICE
CERTIFICATE OF CORRECTION

PATENT NO. : 10,600,787 B2
APPLICATION NO. : 16/078675
DATED : March 24, 2020
INVENTOR(S) : Sansaptak Dasgupta et al.

It is certified that error appears in the above-identified patent and that said Letters Patent is hereby corrected as shown below:

In the Drawings

On sheet 1 of 12, in FIG. 1, Line 3, Reference Numeral 100, Delete "SMARRTPHONE" and insert -- SMARTPHONE --, therefor.

Signed and Sealed this
Second Day of June, 2020

Andrei Iancu
*Director of the United States Patent and Trademark Office*